(12) United States Patent
Sato et al.

(10) Patent No.: US 9,698,009 B2
(45) Date of Patent: Jul. 4, 2017

(54) ATOMIC LAYER DEPOSITION OF FILMS USING SPATIALLY SEPARATED INJECTOR CHAMBER

(71) Applicant: Applied Materials, Inc., Santa Clara, CA (US)

(72) Inventors: Tatsuya E. Sato, San Jose, CA (US); Eran Newman, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/001,681

(22) Filed: Jan. 20, 2016

(65) Prior Publication Data

US 2016/0217999 A1 Jul. 28, 2016

Related U.S. Application Data

(60) Provisional application No. 62/106,482, filed on Jan. 22, 2015.

(51) Int. Cl.
| | |
|---|---|
| *H01L 21/22* | (2006.01) |
| *H01L 21/02* | (2006.01) |
| *H01L 21/311* | (2006.01) |
| *C23C 16/40* | (2006.01) |
| *C23C 16/455* | (2006.01) |

(52) U.S. Cl.
CPC ........ *H01L 21/0228* (2013.01); *C23C 16/403* (2013.01); *C23C 16/45519* (2013.01); *C23C 16/45551* (2013.01); *C23C 16/45563* (2013.01); *H01L 21/02178* (2013.01)

(58) Field of Classification Search
CPC ........... H01L 21/02178; H01L 21/0228; H01L 21/22; H01L 21/02
See application file for complete search history.

(56) References Cited

U.S. PATENT DOCUMENTS

| | | | |
|---|---|---|---|
| 7,175,713 B2 * | 2/2007 | Thakur | ............... C23C 16/4412 118/715 |
| 2004/0129212 A1 * | 7/2004 | Gadgil | .................. C23C 16/452 118/715 |
| 2008/0075858 A1 * | 3/2008 | Koh | ........................ C23C 16/06 427/255.28 |
| 2008/0193643 A1 | 8/2008 | Dip | |
| 2010/0186669 A1 | 7/2010 | Shin | |
| 2013/0196078 A1 | 8/2013 | Yudovsky | |

(Continued)

FOREIGN PATENT DOCUMENTS

| | | |
|---|---|---|
| JP | 2010-518259 A | 8/2008 |
| KR | 10-2010-0128864 A | 12/2010 |
| KR | 10-2013-0139651 A | 12/2013 |

OTHER PUBLICATIONS

PCT International Search Report and Written Opinion in PCT/US2016/014041, dated Apr. 29, 2016, 9 pages.

*Primary Examiner* — Thomas L Dickey
*Assistant Examiner* — Damon Hillman
(74) *Attorney, Agent, or Firm* — Servilla Whitney LLC

(57) ABSTRACT

Methods of depositing a film comprising positioning a plurality of substrates on a substrate support in a processing chamber having a plurality of processing regions, each processing region separated from an adjacent region by a gas curtain. Alternating exposure to first reactive gases, purge gases, second reactive gases, and purge gas in at least one of the processing regions to deposit a film.

17 Claims, 4 Drawing Sheets

(56) References Cited

U.S. PATENT DOCUMENTS

2014/0224177 A1    8/2014  Park
2015/0194298 A1*  7/2015  Lei ..................... H01L 21/0217
                                                        438/680

* cited by examiner

ATOMIC LAYER DEPOSITION OF FILMS USING SPATIALLY SEPARATED INJECTOR CHAMBER

FIELD

This application claims priority to U.S. Provisional Application No. 62/106,482, filed Jan. 22, 2015, the entire disclosure of which is hereby incorporated by reference herein.

FIELD

Embodiments of the present disclosure generally relate to an apparatus for processing substrates. More particularly, the disclosure relates to a batch processing platform for performing atomic layer deposition (ALD) and chemical vapor deposition (CVD) on substrates.

BACKGROUND

The process of forming semiconductor devices is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, for example, 25 or 50 are processed in a given chamber simultaneously. Batch processing is especially beneficial for processes that are too time-consuming to be performed on individual substrates in an economically viable manner, such as for ALD processes and some chemical vapor deposition (CVD) processes.

The semiconductor industry's tolerance for process variability continues to decrease as the size of semiconductor devices shrink. To meet these tighter process controls, the industry has developed a host of new processes which meet the tighter process window, but these processes often take a longer time to complete. For example, ALD is a variant of CVD that demonstrates superior step coverage compared to CVD. ALD is based upon atomic layer epitaxy (ALE) that was originally employed to fabricate electroluminescent displays. ALD employs chemisorption to deposit a saturated monolayer of reactive precursor molecules on a substrate surface. This is achieved by cyclically alternating the pulsing of appropriate reactive precursors into a deposition chamber. Each injection of a reactive precursor is typically separated by an inert gas purge to provide a new atomic layer to previous deposited layers to form a uniform material layer on the surface of a substrate. Cycles of reactive precursor and inert purge gases are repeated to form the material layer to a predetermined thickness. The biggest drawback with ALD techniques is that the deposition rate is much lower than typical CVD techniques by at least an order of magnitude. For example, some ALD processes may have a chamber processing time from about 10 to about 200 minutes to deposit a high quality layer on the surface of the substrate. In choosing such ALD and epitaxy processes for better device performance, the cost to fabricate devices in a conventional single substrate processing chamber would increase due to very low substrate processing throughput. Hence, when implementing such processes, a continuous substrate processing approach is needed to be economically feasible. However, batch processing can often introduce wafer-to-wafer and within-wafer process non-uniformity. Therefore, there is an ongoing need in the art for apparatus and methods to deposit uniform films.

SUMMARY

One or more embodiments of the disclosure are directed to processing methods. A plurality of substrates is positioned on a substrate support in a processing chamber. The processing chamber comprises a plurality of processing regions, each processing region separated from an adjacent region by a gas curtain. A first reactive gas is flowed into one or more of the processing regions while flowing an inert gas into any processing region which does not have a first reactive gas flow. The plurality of substrates is rotated on a substrate support within the processing chamber to pass each of the substrates through each of the processing regions at least once. The flow of the first reactive gas into the processing regions is stopped. A second reactive gas is flowed into one or more of the processing regions while flowing an inert gas into any processing region which does not have a second reactive gas flow. The plurality of substrates is rotated within the processing chamber to pass each of the substrates through each of the processing regions at least once. The flow of the second reactive gas into the processing regions is stopped.

Additional embodiments of the disclosure are directed to processing methods. A plurality of substrates is positioned on a substrate support in a processing chamber. The processing chamber comprises a plurality of processing regions, each processing region separated from an adjacent region by a gas curtain. A first reactive gas is flowed into each processing region. The plurality of substrates is rotated within the processing chamber to expose each of the substrates to at least two processing regions and the gas curtain between. The flow of the first reactive gas is stopped. A second reactive gas is flowed into each processing region. The plurality of substrates is rotated within the processing chamber to expose each of the substrates to at least two processing regions and the gas curtain between. The flow of the second reactive gas is stopped with a purge gas.

Further embodiments of the disclosure are directed to processing method comprising positioning six substrates on a substrate support in a processing chamber. The processing chamber comprises a plurality of processing regions, each processing region separated from adjacent processing regions by a gas curtain. A first reactive gas is flowed into each of the processing regions for a first time and the substrate support is rotated to expose each substrate to at least two adjacent processing regions. The flow of the first reactive gas into the processing regions is stopped. A purge gas is flowed into each of the processing regions for a second time. A second reactive gas is flowed into each of the processing regions for a third time while rotating the substrate support to expose each substrate to at least two adjacent processing regions. The flow of the second reactive gas into the processing regions is stopped. A purge gas is flowed into each of the processing regions for a fourth time.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be

DETAILED DESCRIPTION

Embodiments of the disclosure are directed to apparatus and methods for measuring the gap between the injector assembly and substrate or susceptor assembly. Some embodiments of the disclosure are directed to apparatus and methods for placing a wafer on a susceptor assembly in a reproducible manner. One or more embodiments of the disclosure are directed to apparatus and methods for measuring the temperature of a susceptor assembly. Some embodiments of the disclosure provide static and dynamic 3 D mapping of the gap across the plating area, as well as direct temperature measurement and on the fly adjustment of wafer placement coordinates using cameras, capacitance sensors and design elements to enable monitoring various parameters.

As used in this specification and the appended claims, the terms "wafer", "substrate" and the like are used interchangeably. In some embodiments, the wafer is a rigid, discrete substrate, for example, a 200 mm or 300 mm silicon wafer.

Figure 1:
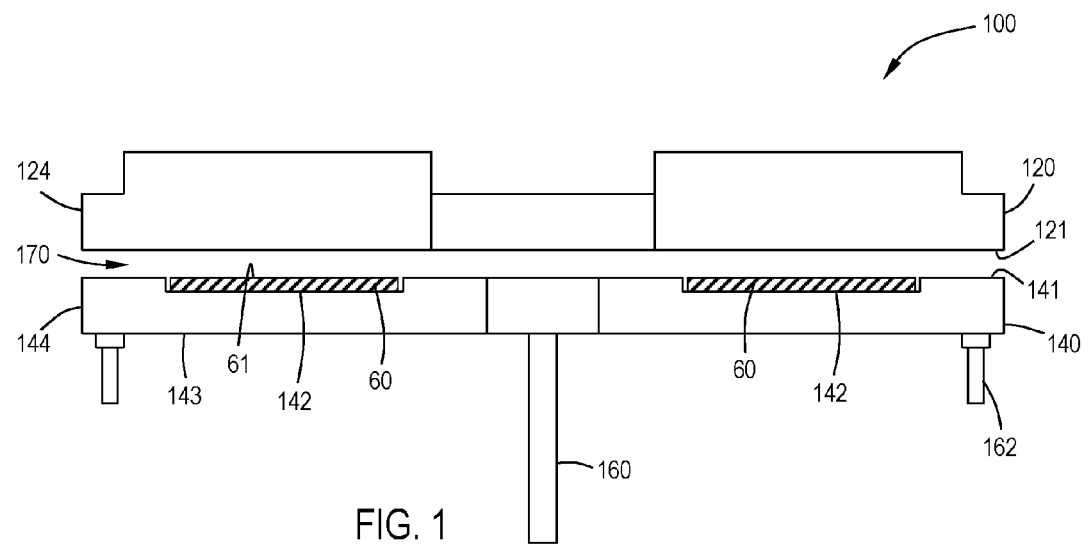
FIG. 1 is a cross-sectional side view of a processing chamber in accordance with one or more embodiment of the disclosure.

FIG. 1 shows cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial ALD gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. The plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, forming a layer on the substrate surface.

Figure 2:
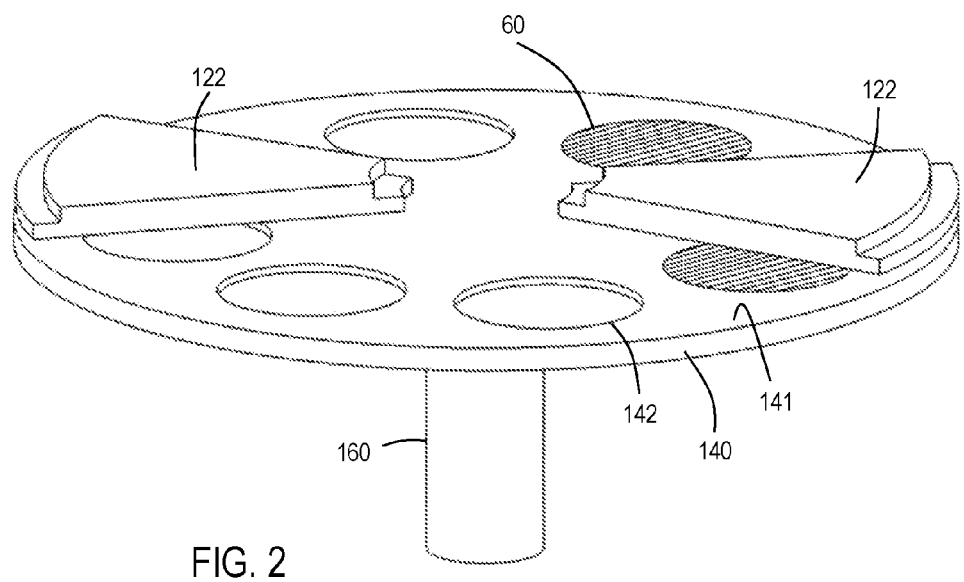
FIG. 2 shows a perspective view of a processing chamber with pie-shaped gas distribution sectors in accordance with one or more embodiments of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

The susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
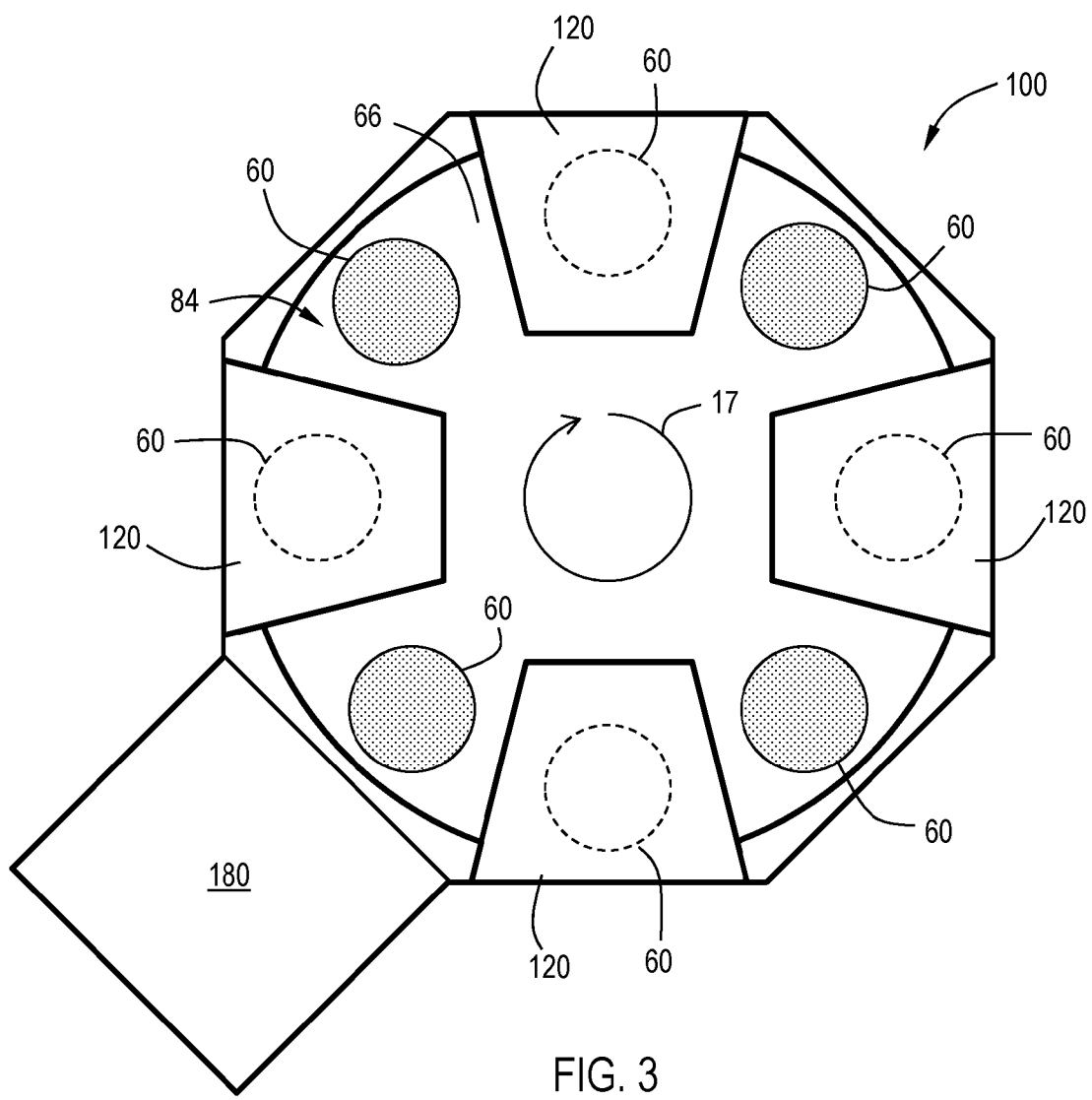
FIG. 3 is a schematic plan view of a substrate processing system configured with four gas distribution assemblies and a loading station in accordance with one or more embodiments of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between injector assemblies 120 to be moved to an injector assembly 120 for film deposition, as illustrated by the dotted circle under the injector assemblies 120. An additional 45° rotation would move the substrates 60 away from the injector assemblies 30. With spatial ALD injectors, a film is deposited on the wafer during movement of the wafer relative to the injector assembly. In some embodiments, the susceptor assembly 140 is rotated in increments that prevent the substrates 60 from stopping beneath the injector assemblies 120. The number of substrates 60 and gas distribution assemblies 120 can be the same or different. In some embodiments, there is the same number of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
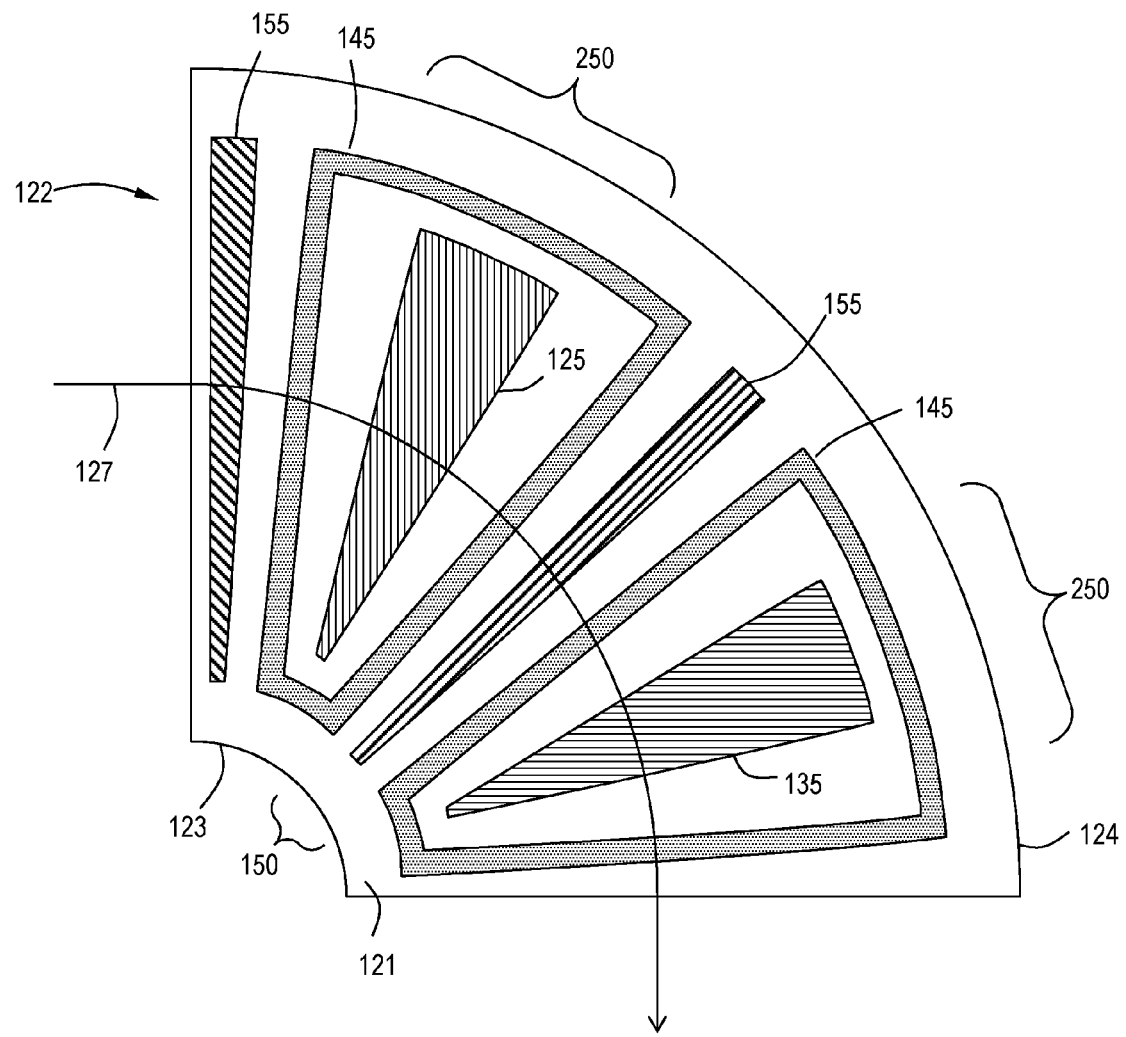
FIG. 4 shows a front schematic view of an injector unit in accordance with one or more embodiments of the disclosure.
Figure 5:
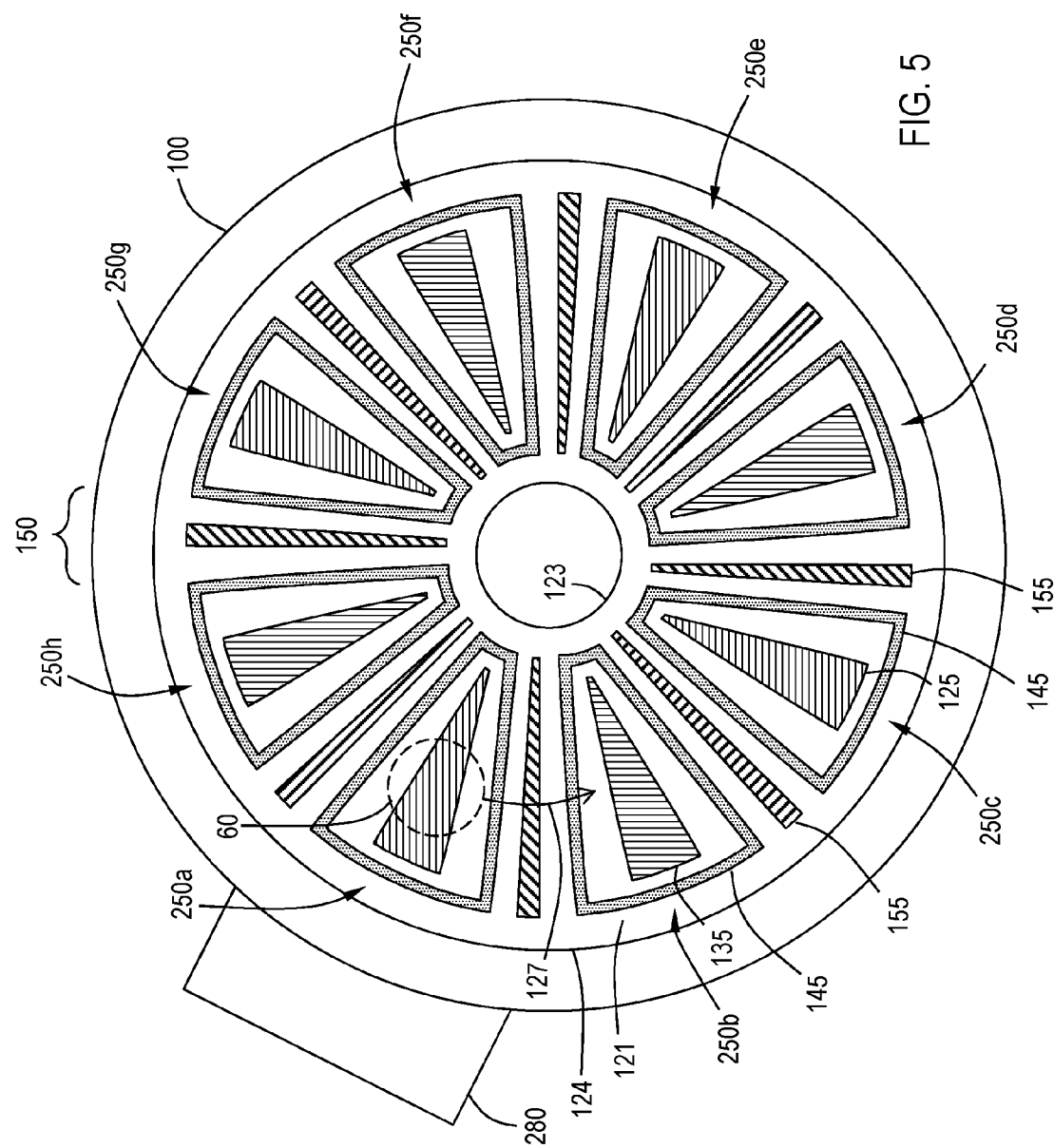
FIG. 5 shows a front schematic view of a gas distribution assembly comprising a plurality of processing regions in accordance with one or more embodiments of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second reactive gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145, 155 extend from an area adjacent the inner peripheral edge 123 toward an area adjacent the outer peripheral edge 124 of the gas distribution assembly 220. The plurality of gas ports shown include a first reactive gas port 125, a second reactive gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second reactive gas port 135 and a vacuum port 145. Thus, at the end of the path 127 shown in FIG. 4, the substrate has been exposed to the first reactive gas 125 and the second reactive gas 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second reactive gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual reactive gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second reactive gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution plate 120. The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first processing region 250a through the eighth processing region 250h, including all processing regions between. For each cycle around the processing chamber, using the gas distribution assembly shown, the substrate 60 will be exposed to four ALD cycles of first reactive gas and second reactive gas.

The conventional ALD sequence in a batch processor, like that of FIG. 5, maintains chemical A and B flow respectively from spatially separated injectors with pump/purge section between. The conventional ALD sequence has a starting and ending pattern which might result in non-uniformity of the deposited film. The inventors have surprisingly discovered that a time based ALD process performed in a spatial ALD batch processing chamber provides a film with higher uniformity. The basic process of exposure to gas A, no reactive gas, gas B, no reactive gas would be to sweep the substrate under the injectors to saturate the surface with chemical A and B respectively to avoid having a starting and ending pattern form in the film. The inventors have surprisingly found that the time based approach is especially beneficial when the target film thickness is thin (e.g., less than 20 ALD cycles), where starting and ending pattern have a significant impact on the within wafer uniformity performance.

Accordingly, embodiments of the disclosure are directed to processing methods comprising a processing chamber 100 with a plurality of processing regions 250a-250h with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250a-250h. The number of gas curtains is generally equal to or greater than the number of processing regions. For example, if region 250a had no reactive gas flow, but merely served as a loading area, the processing chamber would have seven processing regions and eight gas curtains.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250b through processing region 250h, an inert gas would be flowing into processing region 250a. The inert gas can be flowed through the first reactive gas port 125 or the second reactive gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

In some embodiments, the first reactive gas A is flowed into each of the processing regions within the processing chamber. In some embodiments, the first reactive gas is flowed into alternating regions of the processing chamber. Thus, the first reactive gas A is flowed into the first processing region 250a, the third processing region 250c, the fifth processing region 250e and the seventh processing region 250g. The other processing regions would have no reactive gas flow, but may have an inert gas flow (e.g., $N_2$, Ar, He).

The plurality of substrates 60 are rotated within the processing chamber to pass through at least one of the processing regions 250. In some embodiments, each of the plurality of substrates is passed through each of the processing regions at least once. In some embodiments, each of the substrates 60 is exposed to at least two processing regions passing through a gas curtain separating the regions. The substrate is exposed to a processing region if any portion of the substrate was in the region. In some embodiments, a substrate is exposed to a processing region if the entire substrate has been in the processing region, either at one time or in passing through. In one or more embodiments, each substrate is exposed to at least two processing regions having the reactive gas. For example, if the alternating regions are flowing the first reactive gas A and the others flowing an inert gas, the substrate would be exposed to at least two processing regions with the first reactive gas A and any processing region between with the inert gas.

The number of processing regions 250 that the substrate 60 will be exposed to will depend on a number of factors. For example, the rotation speed of the susceptor assembly 140 and the time allowed for surface saturation of the flowing reactive gas. The rotation speed of the susceptor assembly can vary from stationary up to about 30 60 rpm. During processing, the rotational velocity of the susceptor assembly is in the range of zero (e.g., not rotating) to about 30 rpm. The rotational velocity of the susceptor assembly may affect the exposure time of the substrate to the reactive gases. A shorter rotation speed generally results in a longer exposure time, and vice versa. If the susceptor assembly is rotating too quickly, the substrate exposure to the reactive gas may not be sufficient to saturate the wafer surface with reactive species.

After a first time, in which the first reactive gas A exposure is to be ended, the process chamber is purged to remove residual first reactive gas. The first reactive gas A flow is stopped and a purge gas is flowed into the processing regions. The purge gas can be flowing constantly as part of the carrier gas for the reactive gas or can be turned on after stopping the reactive gas flow. In some embodiments, the purge gas flow remains constant throughout so that the pressure in the processing region will be slightly higher when the reactive gas is co-flowed than without. In one or more embodiments, the pressure in the processing region remains substantially the same throughout so that during co-flow of the reactive gas, the amount of purge gas flowing is decreased by the amount of reactive gas co-flowing with the purge gas to maintain pressure. As used in this specification and the appended claims, the term "substantially the same" used in this regard means that the pressure in the individual processing region does not vary by more than 10% relative. In some embodiments, when a reactive gas is co-flowing with a purge gas or carrier gas, stopping the flow of a reactive gas comprises adding additional purge gas to make up for the volume of the reactive gas. During the purge gas time, the substrates can be stationary or rotated. In some embodiments, the substrates are rotated during exposure to the first reactive gas A and the second reactive gas B only. In one or more embodiments, the substrates are rotated through the processing regions at a consistent rate throughout deposition. In some embodiments, the substrates are rotated at different velocities for each of the first reactive gas A and second reactive gas B exposures.

In some embodiments, stopping the flow of the first reactive gas A into the processing regions or the second reactive gas B into the processing regions includes flowing an inert gas into the processing regions. In some embodiments, the inert gas flow replaces the reactive gas flow. In one or more embodiments, the inert gas flows into the processing region at a constant pressure throughout co-flowing with the reactive gas so that the pressure in the process region changes when the reactive gas is flowing versus when the reactive gas is stopped. In some embodiments, each process region independently maintains a substantially constant pressure during processing. As used in this specification and the appended claims, the term "substantially constant pressure" used in this regard means that the pressure in the individual processing region does not vary by more than 10% relative.

After a second time, the purge gas flow has removed substantially all of the residual first reactive gas A from the processing chamber. As used in this specification and the appended claims, the term "substantially all" used in this respect means that enough of the first reactive gas has been removed so that any gas phase reaction with the second reactive gas will not adversely impact the performance of the deposited film. A second reactive gas B is flowed into one or more of the processing regions 250 while an inert gas is flowed into any processing region 250 which does not have a second reactive gas B flowing into it. For example if the second reactive gas is flowing into processing regions 250b through processing region 250h, an inert gas would be flowing into processing region 250a. The inert gas can be flowed through the first reactive gas port 125 or the second reactive gas port 135.

With the second reactive gas B flowing, the plurality of substrates 60 are rotated within the processing chamber to pass through at least one of the processing regions 250. In some embodiments, each of the plurality of substrates is passed through each of the processing regions at least once. In some embodiments, each of the substrates 60 is exposed to at least two processing regions passing through a gas curtain separating the regions. In one or more embodiments, each substrate is exposed to at least two processing regions having the reactive gas. The substrate is exposed to a processing region if any portion of the substrate was in the region. In some embodiments, a substrate is exposed to a processing region if the entire substrate has been in the processing region, either at one time or in passing through. For example, if the alternating regions are flowing the second reactive gas B and the other processing regions are flowing an inert gas, the substrate would be exposed to at least two processing regions with the first reactive gas B and any processing region between with the inert gas.

After a third time, in which the second reactive gas B exposure is to be ended, the flow of the second reactive gas into the process chamber is stopped. The processing chamber can be purged to remove residual second reactive gas. The second reactive gas B flow is stopped and a purge gas is flowed into the processing regions. The purge gas can be flowing constantly as part of the carrier gas for the reactive gas or can be turned on after stopping the reactive gas flow. In some embodiments, the purge gas flow remains constant throughout so that the pressure in the processing region will be slightly higher when the reactive gas is co-flowed than without. In one or more embodiments, the pressure in the processing region remains substantially the same throughout so that during co-flow of the reactive gas, the amount of purge gas flowing is decreased to maintain pressure. As used in this specification and the appended claims, the term "substantially the same" used in this regard means that the pressure in the individual processing region does not vary by more than 30% relative. During the purge gas time, the substrates can be stationary or rotated. In some embodiments, the substrates are rotated during exposure to the first reactive gas A and the second reactive gas B only. In one or more embodiments, the substrates are rotated through the processing regions at a consistent rate throughout deposition. In some embodiments, the substrates are rotated at different velocities for each of the first reactive gas A and second reactive gas B exposures.

The processing chamber is purged for a fourth time to remove substantially all of the residual second reactive gas. The first time, second time, third time and fourth time can be the same or each, independently, different. For example, the first time and the second time may be the same and the third time and the fourth time may be the same but different from the first time and the second time.

In some embodiments, each processing region is independently exposed to one of the first reactive gas and the second reactive gas so that no processing region is exposed to both the first reactive gas and the second reactive gas. For example, process regions 250*a-d* can be exposed to the first reactive gas and process region is 250*e-h* can be exposed to the second reactive gas. While only one reactive gas is flowing at a time, the chamber can be segregated into process regions based on the reactive gas flowing. In some embodiments, the processing regions exposed to the first reactive gas alternate with processing regions exposed to the second reactive gas.

In a broad aspect, the processing chamber comprises at least two processing regions and the substrate support can support at least two substrates. In one or more embodiments, as shown in FIG. 5, the processing chamber comprises eight processing regions and the substrate support can support up to six substrates. In one or more embodiments, the substrate support can support at least two, three, four, five, six, seven, eight, nine, ten, 11 or 12 substrates. In some embodiments, a first processing region 250*a*, a third processing region 250*c*, a fifth processing region 250*e* and a seventh processing region 250*g* are exposed to the reactive gases consisting essentially of the first reactive gas and the second processing region 250*b*, fourth processing region 250*d*, sixth processing region 250*f* and eighth processing region 250*h* are exposed to reactive gases consisting essentially of the second reactive gas. In some embodiments, alternating processing regions (for example, even numbered regions) are exposed to the reactive gases consisting essentially of the first reactive gas or (for example, odd numbered regions) the reactive gases consisting essentially of the second reactive gas.

In one or more embodiments, an aluminum oxide film is deposited by sequential exposure to trimethylaluminum (TMA) and water. The inert gas can be any suitable inert gas including, but not limited to $N_2$. In some embodiments, TMA is flowed into at least one of the processing regions and the substrate is exposed to the TMA for a first time. The first time, the time of exposure to the first reactive gas, of some embodiments, is less than about 10 s. In some embodiments, the first time is less than or equal to about 6 seconds, 5 seconds, 4 seconds, 3 seconds or 2 seconds.

In one or more embodiments, a titanium nitride film is deposited by sequential exposure to titanium tetrachloride and ammonia. The inert gas can be any suitable inert gas including, but not limited to N2. In some embodiments, titanium tetrachloride is flowed into at least one of the processing regions and the substrate is exposed to the titanium tetrachloride for a first time. The first time of some embodiments is less than or equal to about 6 seconds, 5 seconds, 4 seconds, 3 seconds or 2 seconds.

The rotation speed may be changed to increase or decrease the exposure. In some embodiments, the substrates are rotated on a substrate support at a speed of about 5 rpm, 6 rpm, 7 rpm, 8 rpm, 9 rpm, 10 rpm, 11 rpm, 12 rpm, 13 rpm, 14 rpm or 15 rpm. In some embodiments, the substrate support is rotated at a speed in the range of about 5 rpm to about 15 rpm, or in the range of about 7 rpm to about 13 rpm.

In one or more embodiments, TMA is flowed into each of eight processing regions. Six substrates are rotated at a speed in the range of about 8 rpm and about 12 rpm. The substrates are exposed to TMA for a first time having a length in the range of 1 second and 2 seconds. The TMA flow is stopped to all of the processing regions and nitrogen, which has been flowing as a carrier gas, purges the processing regions for a second time in the range of about 1 second to about 2 seconds. Water is flowed into each of the processing regions and exposed to the substrates for a third time greater than about six seconds. The water is stopped and nitrogen, with has been flowing as a carrier gas, purges the processing regions for a fourth time of at least about six seconds. The cycle is then repeated to form a film with a predetermined thickness. In some embodiments, the cycle is repeated to deposit a film having a mean thickness less than about 50 Å, 45 Å, 40 Å, 35 Å, 30 Å, 25 Å or 20 Å. In some embodiments, the range of film thicknesses, from minimum thickness to maximum thickness, across the substrate is less than about 6% relative to the mean, or less than about 5% relative to the mean, or less than about 4% relative to the mean. In some embodiments, the mean thickness after 15 cycles is in the range of about 27 Å to about 28.5 Å and the total deposition time is less than about 250 seconds.

In one or more embodiments, titanium tetrachloride is flowed into each of eight processing regions. Six substrates are rotated at a speed in the range of about 8 rpm and about 12 rpm. The substrates are exposed to titanium tetrachloride for a first time having a length in the range of 1 second and 2 seconds. The titanium tetrachloride flow is stopped to all of the processing regions and nitrogen, which has been flowing as a carrier gas, purges the processing regions for a second time in the range of about 1 second to about 2 seconds. Ammonia is flowed into each of the processing regions and exposed to the substrates for a third time greater than about six seconds. The ammonia is stopped and nitrogen, with has been flowing as a carrier gas, purges the processing regions for a fourth time of at least about six seconds. The cycle is then repeated to form a film with a predetermined thickness. In some embodiments, the cycle is repeated to deposit a film having a mean thickness less than about 50 Å, 45 Å, 40 Å, 35 Å, 30 Å, 25 Å or 20 Å. In some embodiments, the range of film thicknesses, from minimum thickness to maximum thickness, across the substrate is less than about 6% relative to the mean, or less than about 5% relative to the mean, or less than about 4% relative to the mean. In some embodiments, the mean thickness after 15 cycles is in the range of about 27 Å to about 28.5 Å and the total deposition time is less than about 250 seconds.

EXAMPLES

Aluminum oxide was deposited onto silicon wafers by alternating pulses of trimethylaluminum (TMA) and water. Nitrogen flow was on at all times as a carrier gas or purge gas. The substrates were rotated at a speed of about 10 rpm. Results are shown in Table 1.

TABLE 1

| Sample | TMA (s) | Purge (s) | $H_2O$ (s) | Purge (s) | ALD Cycles | Cycle Time (s) | Mean (Å) | Range (Å) |
|---|---|---|---|---|---|---|---|---|
| 1 | 6 | 12 | 6 | 12 | 20 | 36 | 33.63 | 1.67 |
| 2 | 6 | 6 | 6 | 6 | 20 | 24 | 34.86 | 1.73 |
| 3 | 3 | 6 | 6 | 6 | 20 | 21 | 33.99 | 1.75 |
| 4 | 1.5 | 6 | 6 | 6 | 20 | 19.5 | 33.16 | 1.62 |
| 5 | 6 | 6 | 3 | 6 | 20 | 21 | 31.70 | 2.01 |
| 6 | 6 | 6 | 1.5 | 6 | 20 | 19.5 | 17.42 | 3.45 |
| 7 | 1.5 | 3 | 6 | 6 | 20 | 16.5 | 33.48 | 1.27 |
| 8 | 1.5 | 1.5 | 6 | 6 | 20 | 15 | 33.93 | 1.18 |
| 9 | 1.5 | 1 | 6 | 6 | 20 | 14.5 | 34.13 | 1.26 |
| 10 | 1.5 | 6 | 6 | 3 | 20 | 16.5 | 33.57 | 1.42 |
| 11 | 1.5 | 6 | 6 | 1.5 | 20 | 15 | 34.32 | 2.11 |
| 12 | 1.5 | 6 | 6 | 1 | 20 | 14.5 | 34.72 | 2.88 |
| 13 | 1.5 | 1.5 | 6 | 4.5 | 20 | 13.5 | 34.82 | 1.75 |
| 14 | 1.5 | 1.5 | 4.5 | 4.5 | 20 | 12 | 33.91 | 1.72 |
| 15 | 1.5 | 1.5 | 6 | 6 | 5 | 15 | 16.31 | 0.67 |
| 16 | 1.5 | 1.5 | 6 | 6 | 10 | 15 | 22.39 | 1.00 |
| 17 | 1.5 | 1.5 | 6 | 6 | 15 | 15 | 27.98 | 0.91 |
| 18 | 1.5 | 1.5 | 6 | 6 | 15 | 15 | 28.04 | 1.11 |
| 19 | 1.5 | 1.5 | 6 | 6 | 15 | 15 | 28.05 | 0.91 |

While the foregoing is directed to embodiments of the present disclosure, other and further embodiments of the disclosure may be devised without departing from the basic scope thereof, and the scope thereof is determined by the claims that follow.

What is claimed is:

1. A processing method comprising:
    positioning a plurality of substrates on a substrate support in a processing chamber, the processing chamber comprising a plurality of processing regions, each processing region separated from an adjacent region by a gas curtain;
    flowing a first reactive gas into one or more of the processing regions while flowing an inert gas into any processing region which does not have a first reactive gas flow;
    rotating the plurality of substrates on a substrate support within the processing chamber to pass each of the substrates through each of the processing regions at least once;
    stopping the flow of the first reactive gas into the processing regions;
    flowing a second reactive gas into one or more of the processing regions while flowing an inert gas into any processing region which does not have a second reactive gas flow;
    rotating the plurality of substrates within the processing chamber to pass each of the substrates through each of the processing regions at least once;
    stopping the flow of the second reactive gas into the processing regions; and
    alternating a rotational speed of the substrate support during exposure to the first reactive gas relative to the exposure to the second reactive gas.

2. The method of claim 1, wherein stopping the flow of the first reactive gas into the processing regions or the second reactive gas into the processing regions further comprises flowing an inert gas into the processing regions.

3. The method of claim 2, wherein flowing the inert gas into the processing region replaces the flow of the first reactive gas or the second reactive gas.

4. The method of claim 1, wherein each processing region independently maintains a substantially constant pressure during processing.

5. The method of claim 1, wherein flowing the first reactive gas into the processing regions comprises all of the processing regions.

6. The method of claim 1, wherein flowing second reactive gas into the processing regions comprises all of the processing regions.

7. The method of claim 1, wherein each processing region independently is exposed to one of the first reactive gas and the second reactive gas so that no processing region is exposed to both the first reactive gas and the second reactive gas.

8. The method of claim 7, wherein the processing regions exposed to the first reactive gas alternate with processing regions exposed to the second reactive gas.

9. The method of claim 1, wherein the processing chamber comprises at least two processing regions and the substrate support can support at least two substrates.

10. The method of claim 9, wherein alternating processing regions are exposed to the reactive gases consisting essentially of the first reactive gas or the reactive gases consisting essentially of the second reactive gas.

11. A processing method comprising:
    positioning a plurality of substrates on a substrate support in a processing chamber, the processing chamber comprising a plurality of processing regions, each processing region separated from an adjacent region by a gas curtain;
    flowing a first reactive gas into each processing region;
    rotating the plurality of substrates within the processing chamber to expose each of the substrates to at least two processing regions and the gas curtain between;
    stopping the flow of the first reactive gas comprising adding an additional amount of purge gas to make up for a volume of the stopped flow;
    flowing a second reactive gas each processing region;
    rotating the plurality of substrates within the processing chamber to expose each of the substrates to at least two processing regions and the gas curtain between; and
    stopping the flow of the second reactive gas comprising adding an additional amount of purge gas to make up for a volume of the stopped flow.

12. The method of claim 11, wherein the first reactive gas is co-flowed with a carrier gas and the second reactive gas is co-flowed with a carrier gas.

13. The method of claim 12, wherein the carrier gas comprises the purge gas.

14. The method of claim 11, wherein there are eight processing regions and the substrate support holds up to six substrates.

15. A processing method comprising:
    positioning six substrates on a substrate support in a processing chamber, the processing chamber comprising a plurality of processing regions, each processing region separated from adjacent processing regions by a gas curtain;
    flowing a first reactive gas into each of the processing regions for a first time less than about 3 seconds and rotating the substrate support to expose each substrate to at least two adjacent processing regions;
    stopping the flow of the first reactive gas into the processing regions;
    flowing a purge gas into each of the processing regions for a second time less than about 3 seconds;
    flowing a second reactive gas into each of the processing regions for a third time less than about 12 seconds while rotating the substrate support to expose each substrate to at least two adjacent processing regions;
    stopping the flow of the second reactive gas into the processing regions; and
    flowing a purge gas into each of the processing regions for a fourth time less than about 12 seconds.

16. The method of claim 15, wherein the substrate support is rotated at a substantially constant speed throughout processing.

17. The method of claim 15, wherein the first reactive gas comprises trimethylaluminum and the second reactive gas comprises water.

* * * * *